(12) United States Patent
Tsuchiya et al.

(10) Patent No.: US 6,169,617 B1
(45) Date of Patent: Jan. 2, 2001

(54) INFORMATION CARD HAVING OPTICAL COMMUNICATION INTERFACE SECTIONS AT A PLURALITY OF ITS SURFACES AND READ/WRITE DEVICE FOR INFORMATION CARD HAVING SEPARATE INTERFACE UNIT

(75) Inventors: Kazuhiko Tsuchiya; Yuichi Kato, both of Hyogo (JP)

(73) Assignee: Mitsubishi Denki Kabushiki Kaisha, Tokyo (JP)

( * ) Notice: Under 35 U.S.C. 154(b), the term of this patent shall be extended for 0 days.

(21) Appl. No.: 09/017,677

(22) Filed: Feb. 3, 1998

(30) Foreign Application Priority Data

Jul. 30, 1997 (JP) ............................................... 9-204542

(51) Int. Cl.[7] ................................................. H04B 10/00
(52) U.S. Cl. ............................ 359/152; 359/163; 359/144
(58) Field of Search ........................... 359/142, 144–146, 359/152, 159, 163–164, 172, 180

(56) References Cited

U.S. PATENT DOCUMENTS 5,781,321 * 7/1998 Kobayashi ........................... 359/152
5,900,958 * 5/1999 Nakamura ........................... 359/159

FOREIGN PATENT DOCUMENTS 6-163343  6/1994 (JP) .

* cited by examiner

*Primary Examiner*—Kinfe-Michael Negash
(74) *Attorney, Agent, or Firm*—McDermott, Will & Emery

(57) ABSTRACT

An information card includes a card body having a plurality of surfaces and a plurality of optical communication interface sections provided respectively at different surfaces. A read/write device for the information card includes: a case having surfaces each processed into a prescribed shape; a main board which is provided in the case and has connectors provided respectively at positions corresponding to the surfaces; and a user interface board having a user interface section which can be joined to the main board via the connector and is fit to the prescribed shape when joined to the main board. Another read/write device includes: a case; an electronic circuit provided in the case; a connector connected to an input/output section of the electronic circuit provided to the case; and an interface unit which is provided separately from the case, and includes either one or both of an optical communication interface section and a user interface section which can be electrically connected to the electronic circuit via the connector and a cable, respectively.

8 Claims, 20 Drawing Sheets

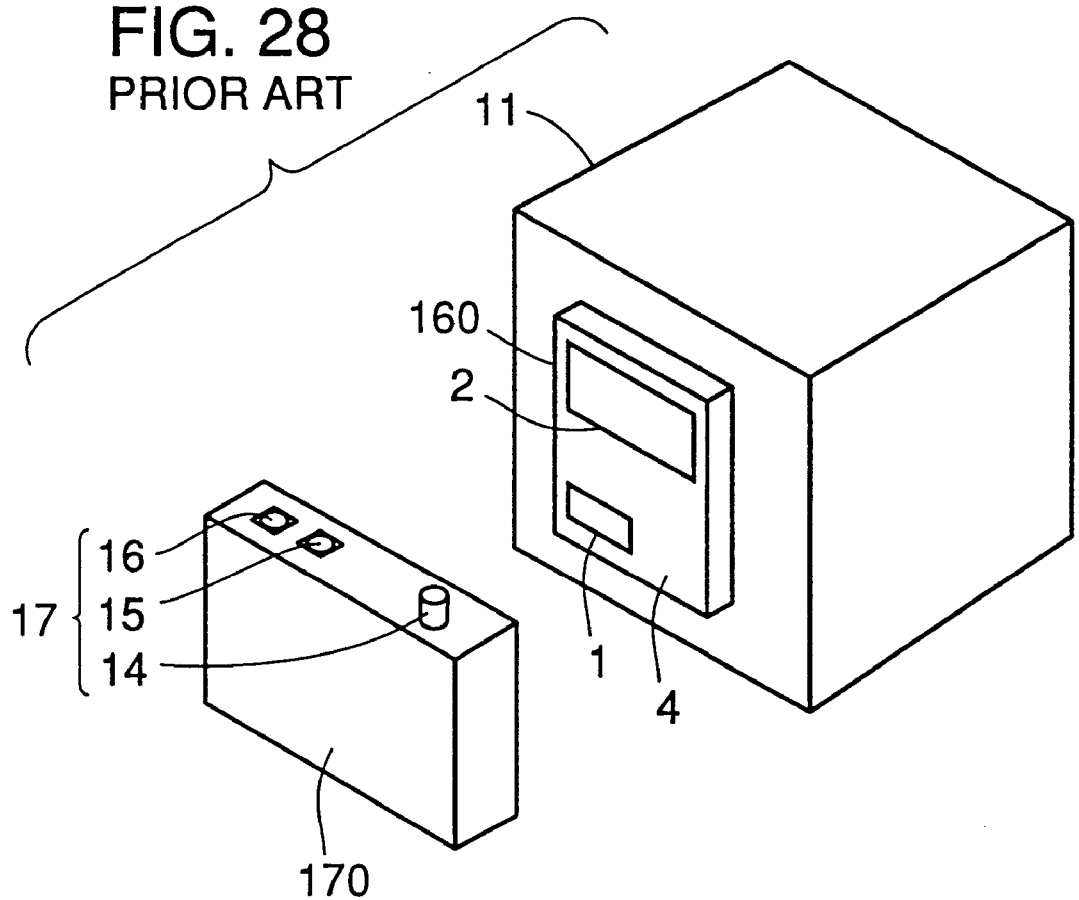

INFORMATION CARD HAVING OPTICAL COMMUNICATION INTERFACE SECTIONS AT A PLURALITY OF ITS SURFACES AND READ/WRITE DEVICE FOR INFORMATION CARD HAVING SEPARATE INTERFACE UNIT

BACKGROUND OF THE INVENTION

1. Field of the Invention

The present invention relates to an information card used in a production system, and to a read/write device for the information card. In particular, the invention relates to an information card (hereinafter referred to as "ID card") which is attached to a side of a case containing a piece of work (called work case or cassette), carried with the work, holds information specific to the work, and has an optical communication function for identifying the work, and relates to a read/write device for the optical communication with the ID card.

2. Description of the Background Art

Recently, there has been a demand mainly in the semiconductor industry towards a technique for manufacturing many types of products in small volumes. Under a production system which has been employed recently, an ID card storing information which specifies a piece of work is attached to each work case on which some working is performed, and each production apparatus reads the information and applies a proper process to the work. Such a production system enables many types of products to be automatically manufactured using the same equipment. A method of communication employed between the ID card and the production apparatuses (or production system) is the optical communication.

Referring to FIGS. 21 and 22A–22D, a conventional ID card 160 has an ID card forward direction optical communication interface section 1 and a display section 2 at its front 4. A top surface 5, both of side surfaces 6, a bottom surface 7 and a back surface of ID card 160 have no equipment for the optical communication.

Referring to FIG. 23, within ID card 160, a control circuit 180 formed of an electronic circuit and connected to optical communication interface section 1 and display section 2 as well as a storage circuit 182 formed of a memory and connected to control circuit 180 are provided.

ID card 160 is attached to each work case which is to be processed by the production system such that ID card 160 faces in a prescribed direction. ID card 160 performs the optical communication with a read/write device attached to the production apparatus. A proper operation is automatically carried out for each piece of work using the information.

Referring to FIG. 24, a conventional read/write device 170 performing reading/writing for ID card 160 is provided with a user interface section 17 including: a read/write start instructing section 14 used when an operator gives a command to perform the read/write operation for the ID card; a read/write progress display section 16 for informing the operator that the read/write operation for the ID card is in progress or completed; and a read/write error display section 15 for informing the operator of whether or not there is an error concerning the read/write operation for the ID card. In the example shown in FIG. 24, user interface section 17 is provided at the top surface of read/write device 170. Read/write device 170 exchanges information with the operator via user interface section 17. Read/write device 170 is further provided with a read/write device optical communication interface section 13 provided at its front for the optical communication with optical communication interface section 1 of ID card 160.

FIG. 25 shows a layout of an internal board and respective elements seen from the front side of conventional read/write device 170 having user interface section 17 at its top surface. On the inside of a case 40 of the read/write device of the type having the user interface at its top surface, a top surface user interface type read/write device board 39 is provided which includes: user interface section 17 having read/write start instructing section 14, read/write error display section 15 and read/write progress display section 16; read/write device optical communication interface section 13 having an optical transmitting section 22 and an optical receiving section 23; other elements (not shown); and interconnections.

FIG. 26 shows a layout of an internal board and respective elements seen from the front side of a conventional read/write device 172 of a type having user interface section 17 at its bottom surface. On the inside of a case 240 of bottom surface user interface type read/write device 172, a bottom surface user interface type read/write device board 239 is provided which includes: user interface section 17 having read/write start instruction section 14, read/write error display section 15 and read/write progress display section 16; read/write device optical communication interface section 13 having optical transmitting section 22 and optical receiving section 23; other elements (not shown); and interconnections.

Referring to FIG. 27, a process performed by control circuit 180 of ID card 160 shown in FIGS. 21 and 22A–22D has a following control structure. When the power is turned on, control circuit 180 reaches a state of waiting for reception of a signal from the read/write device (70). If there is a signal from the read/write device, control circuit 180 receives the signal from the read/write device via optical communication interface section 1 (190). According to contents of the signal thus received, update of internal data, update of data displayed on display section 2, a prescribed calculation, and the like are carried out (78). After these processes, control circuit 180 transfers a result of its operation back to the read/write device via optical communication interface section 1 (192).

FIG. 28 shows an arrangement of conventional ID card 160 shown in FIGS. 21–23 and conventional read/write device 170 shown in FIGS. 24 and 25 when the optical communication is carried out between the ID card and the read/write device. As shown in FIG. 28, ID card 160 is placed in a holder provided on a prescribed surface of a work case 11 such that the back surface of ID card 160 faces toward work case 11. In this case, the method of housing a work in work case 11 is predetermined in order to enable, for example, a wafer carry robot provided for each production apparatus to insert or draw the work (object to be processed such as a semiconductor substrate) into or out of work case 11. As a result, the position for placement of and the posture of work case 11 is predetermined for each production apparatus. Consequently, the direction in which front 4 of ID card 160 faces is determined for each production apparatus. An optical element used for the optical transmitting section constituting interface section 1 has the directivity, and an optical element used for the read/write device optical communication interface section of read/write device 170 also has the directivity. Therefore, the read/write device optical communication interface section should be arranged at a position opposite to front 4 of the ID card having ID card forward direction optical communication interface section 1.

FIG. 29A is a top view of the arrangement of FIG. 28, and FIG. 29B is a side view of FIG. 28. In FIGS. 29A and 29B, the direction of the optical communication between top surface user interface type read/write device 170 and ID card 160 is shown by an arrow 42.

FIG. 30 is a perspective view of a production apparatus 43 using conventional ID card 160 and top surface user interface type read/write device 170 which is the conventional read/write device shown in FIGS. 24 and 25. With reference to FIG. 30, when a certain process is carried out by production apparatus 43, work case 11 is mounted on production apparatus 43 such that ID card 160 is positioned at the front of work case 11. Top surface user interface type read/write device 170 is placed with a fixing arm 44 in front of work case 11 seen from the front side of production apparatus 43 such that user interface section 17 faces upward and read/write device optical communication interface section 13 faces in the direction of ID card 160 considering the limitation of the positional relationship with ID card 160.

FIG. 31 is a perspective view of a production apparatus 45 using conventional ID card 160 and bottom surface user interface type read/write device 172 which is the conventional read/write device shown in FIG. 26. Work case 11 is mounted on production apparatus 45 such that ID card 160 is positioned on the top surface of work case 11. In this case, bottom surface user interface type read/write device 172 is placed with a fixing arm 46 above work case 11 such that a bottom surface 48 of the read/write device faces forward seen from the front side of production apparatus 45 and read/write device optical communication interface section 13 faces in the direction of ID card 160 considering the limitation of the positional relationship with ID card 160.

By the production system thus using ID card 160 and read/write device 170 or 172, work case 11 is transferred between respective production apparatuses and a prescribed process is carried out for work case 11. A general operation of such a production system is hereinafter described using top surface user interface type read/write device 170 as one example. An operator or a work transfer robot places work case 11 at production apparatus 43 (FIG. 30), for example. The posture of work case 11 is predetermined as described above. ID card 160 is attached to work case 11 in advance.

The optical communication between read/write device 170 and ID card 160 is performed by manipulation by the operator of read/write start instructing section 14 provided for user interface section 17 of read/write device 170, or by reception of a command to instruct start of reading/writing by read/write device 170 from a read/write device controller (not shown). In this case, read/write progress display section 16 flashes on and off in green during communication with ID card 160, and progress display section 16 is temporarily extinguished except for a case in which an error occurs, after completion of the communication. If a work is placed at a proper production apparatus, the optical communication is carried out again after the processing of the work completes, and data indicating completion of the processing of the work is written into ID card 160. At this time, progress display section 16 also flashes on and off in green. After the writing of data, progress display section 16 is lighted in green. After the completion of the processing and the completion of writing of data, work case 11 can be transferred to the next production apparatus.

If a work is placed at an improper production apparatus, an error display command is issued by a host computer (not shown), read/write error display section 15 is lighted in red, and occurrence of an error is informed to the operator by ringing of an internal buzzer. The operator removes the work case from the production apparatus and manipulates read/write start instructing section 14. Read/write error display section 15 is then extinguished and the ringing of the buzzer is stopped.

In this case, the optical communication between ID card 160 and read/write device 170 is used as follows. Information for specifying a work in work case 11 or the like is stored in ID card 160 in advance as described above. Information concerning ID card 160 obtained by read/write device 170 through the optical communication is reported to a host computer (not shown) controlling the production via a read/write device controller (not shown) connected to read/write device 170 with a cable. The host computer carries out a calculation for the production control using the contents of the report and information for the production control which can be known by the host computer. The host computer provides, an operation command, a movement command, information on abnormalities of the position at which the work is placed, and other information concerning the production, to production apparatus 43, read/write device 170, the work transfer robot, the operator, and other production equipment according to the result of the calculation. ID card 160 stores information supplied from read/write device 170. If necessary, verification of the information stored in card 160 is carried out.

If the conventional ID card 160 shown in FIGS. 21–23 and read/write device 170 or 172 are employed, the limitation of the posture of work case 11 and the directivity of the light used in the optical communication between ID card 160 and read/write device 170 or 172 restrict the relative arrangement of the card and the device greatly. For example, if production apparatus 43 as shown in FIG. 30 is used, top surface user interface type read/write device 170 should be placed at the position shown in FIG. 30. If production apparatus 45 as shown in FIG. 31 is used, bottom surface user interface type read/write device 172 should be placed at the position shown in FIG. 31. In this case, if read/write device 170 shown in FIG. 30 is used instead of read/write device 172 of FIG. 31, user interface section 17 is positioned opposite to the user. Therefore, bottom surface user interface type read/write device 172 having the user interface section arranged differently from read/write device 170 as described above should be separately prepared.

Since the relative arrangement of the ID card and the read/write device is restricted, arm 44 or 46 should be prepared for each production apparatus as shown in FIG. 30 or FIG. 31. In addition, if the arrangement shown in FIG. 30 is used, since read/write device 170 and fixing arm 44 are placed in front of work case 11, they hinder operations by the operator and the work transfer robot. This problem also occurs if the arrangement shown in FIG. 31 is used. Further, since read/write device 170 or 172 should be placed near work case 11 as shown in FIG. 30 or FIG. 31, any foreign matter, dust or contaminant generated by manipulation of the user interface section 17 by the operator adheres to the work in the work case 11. If the work is a semiconductor substrate, for example, the quality of the product is significantly degraded by the foreign matter, dust or contaminant. Especially in the arrangement shown in FIG. 31, the foreign matter generated by the manipulation of user interface section 17 drops toward work case 11, resulting in an adverse effect to the quality of the product.

SUMMARY OF THE INVENTION

One object of the invention is to provide an information card or a read/write device for the information card by which the productivity of a production system as well as the quality of products can be improved.

Another object of the invention is to provide an information card by which a read/write device for the information card can be placed at a position which enables the productivity of a production system and the quality of products both to be improved.

Still another object of the invention is to provide an information card by which a read/write device for the information card can be placed at a position which enables an easy operation by an operator and reduction of an adverse effect of any foreign matter generated through the operation to the product.

Still another object of the invention is to provide a read/write device for an information card which can be arranged at a position which enables the optical communication according to the direction of the information card in operation.

A further object of the invention is to provide a read/write device for an information card which can be arranged at a position which enables the optical communication according to the direction of the information card in operation and can be arranged at a position which enables reduction of an adverse effect of any foreign matter generated through the operation to the product.

An information card according to an aspect of the present invention is for identifying a work and has a function of optical communication. The card is attached to a work case and carried with the work in a production system. The information card includes a card body having a plurality of surfaces and a plurality of optical communication interface sections provided respectively at different surfaces of the plurality of surfaces.

The optical communication interface sections are provided at the plurality of surfaces of the information card. The position of a read/write device can be selected, out of a plurality of positions which enable the optical communication with the plurality of optical communication interface sections, as a position which does not hinder an operation by an operator or a work transfer robot. In addition, the read/write device can be placed at a position which does not have an adverse effect to the work by any foreign matter, dust or contaminant generated through operation of the read/write device. Consequently, the operational efficiency of the operator or the work transfer robot improves to increase the productivity, and the quality of the products is also improved.

The optical communication interface sections may be provided at two of the surfaces of the information card adjacent to each other respectively, or may be provided at two side surfaces opposite to each other. The optical communication interface sections may be provided respectively at three surfaces including the front surface.

According to another aspect of the invention, the read/write device for the information card includes a case having a plurality of surfaces each processed into a prescribed shape, a main board placed in the case and having a plurality of connectors provided at positions corresponding to the plurality of surfaces, and a user interface board having a user interface section which can be joined to the main board via the connectors and is fit to a prescribed shape when it is joined to the main board.

The user interface section can be positioned at a desired surface of the plurality of surfaces of the case. The read/write device can be placed at a position which does not hinder an operator or a work transfer robot and does not have an adverse effect to a work, and the user interface section can be placed at a position which enables an easier operation by the operator when the optical communication is carried out with the information card. There is no need to prepare read/write devices of a plurality of types, and only common components may be prepared. Accordingly, the operational efficiency of the operator or the work transfer robot is improved to increase the productivity, the quality of the products can be improved, and the production cost of the read/write device can be reduced.

According to still another aspect of the invention, the read/write device for the information card includes a case, an electronic circuit provided in the case, a connector provided for the case and connected to an input/output section of the electronic circuit, and an interface unit separated from the case, which can be connected electrically to the electronic circuit via the connector and a cable and has at least one or both of a first optical communication interface section and a first user interface section.

Since the interface unit is provided separately from the case of the read/write device, the position for placing the case of the read/write device is not restricted when the optical communication with information card is carried out or the read/write device is operated. The read/write device and the interface unit can be arranged at positions which do not hinder the operator or the work transfer robot and have less adverse effect to the work. In this case, the interface unit or the read/write device can be positioned such that the optical communication with the information card is easy to perform. As a result, the operational efficiency of the operator or the work transfer robot is improved to increase the productivity, and the quality of the products can be improved.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 28 is a perspective view of the conventional ID card and the read/write device showing their relative arrangement.

DESCRIPTION OF THE PREFERRED EMBODIMENTS (First Embodiment)

Figure 1:
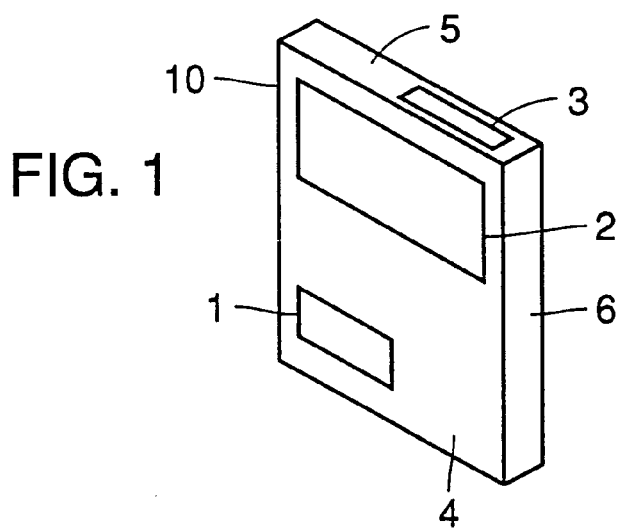
FIG. 1 is a perspective view of an ID card according to the first embodiment.
Figure 2B:
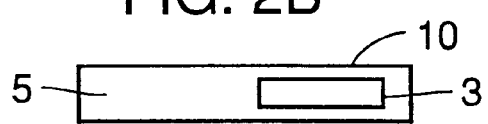
FIGS. 2A–2D respectively show the front, top, side, bottom surfaces of the ID card shown in FIG. 1.
Figure 2A:
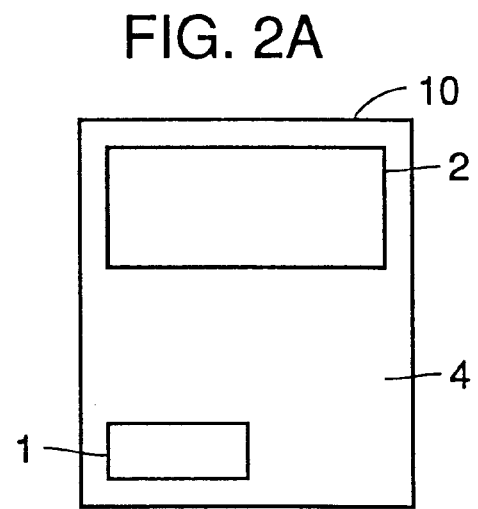
Figure 2C:
Figure 2D:
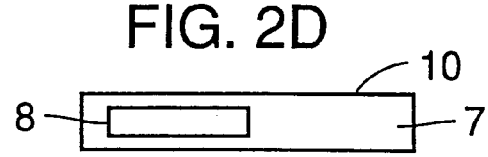
Figure 21:
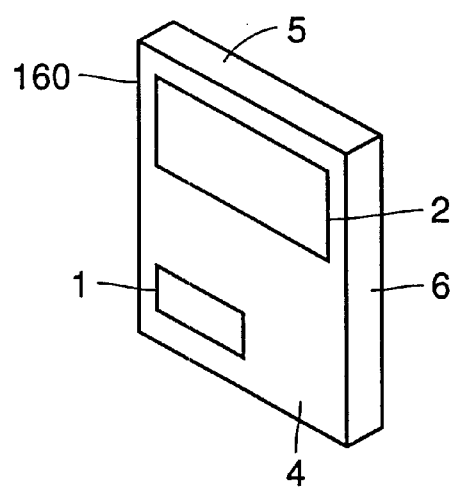
FIG. 21 is a perspective view of a conventional ID card.
Figure 22B:
FIGS. 22A–22D respectively show the front, top, side and bottom surfaces of the ID card shown in FIG. 21.
Figure 22A:
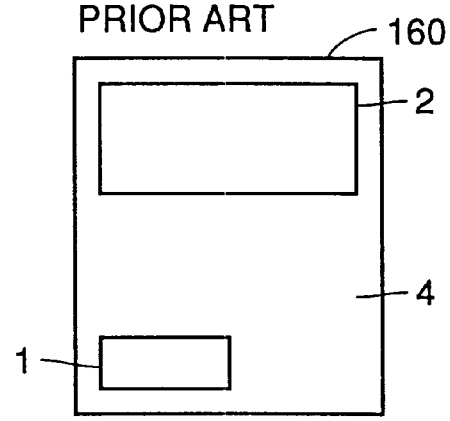
Figure 22C:
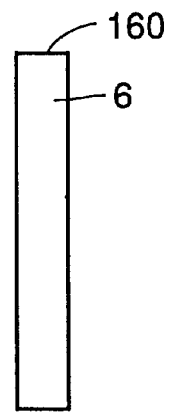
Figure 22D:
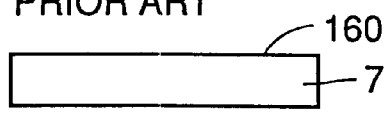

Referring to FIGS. 1 and 2, an ID card 10 according to the first embodiment of the invention is characterized in that it is provided with optical communication interface sections 3 and 8 at its top surface 5 and bottom surface 7 in addition to an optical communication interface section 1 at its front surface 4. Components of FIGS. 1 and 2 that are identical to those of ID card 160 shown in FIGS. 21 and 22 are indicated by the same reference characters. The functions of those components are also identical. Detailed descriptions of those are not repeated here.

One characteristic of the first embodiment is that the optical communication interface sections are provided not only at the front surface but also at other surfaces of ID card 10 and communication with a read/write device is possible in a plurality of directions even if the direction of ID card 10 is fixed.

Figure 3:
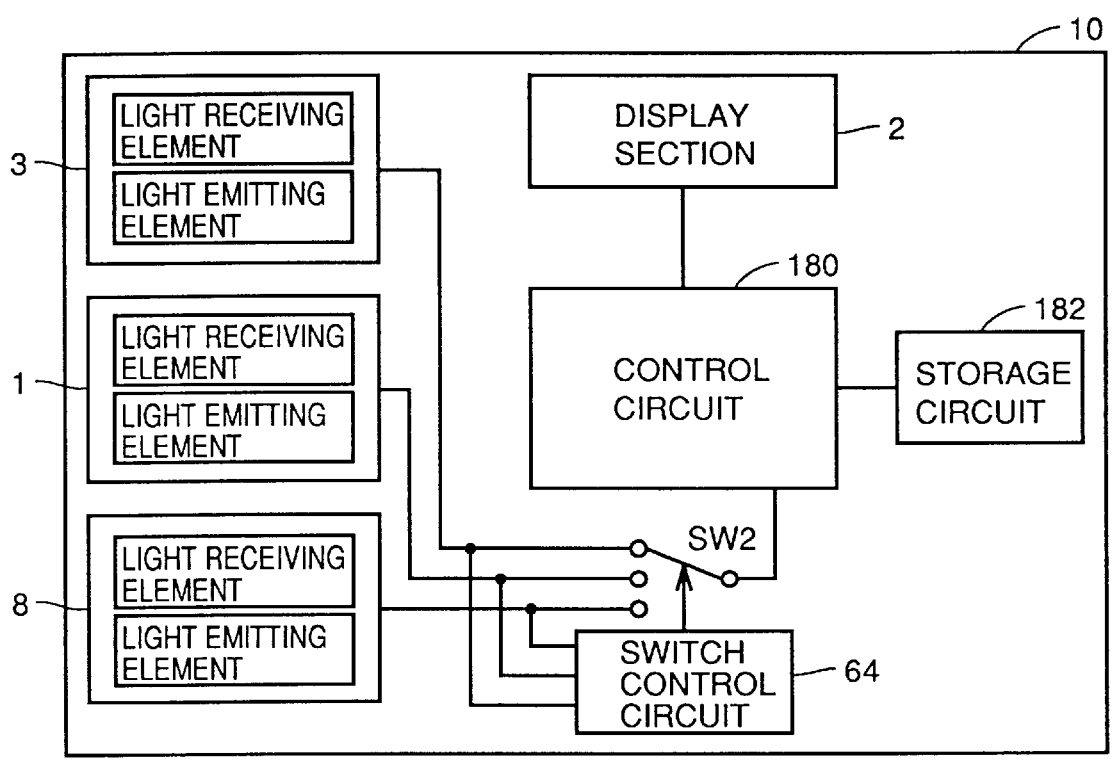
FIG. 3 is a block diagram of the ID card according to the first embodiment.
Figure 23:
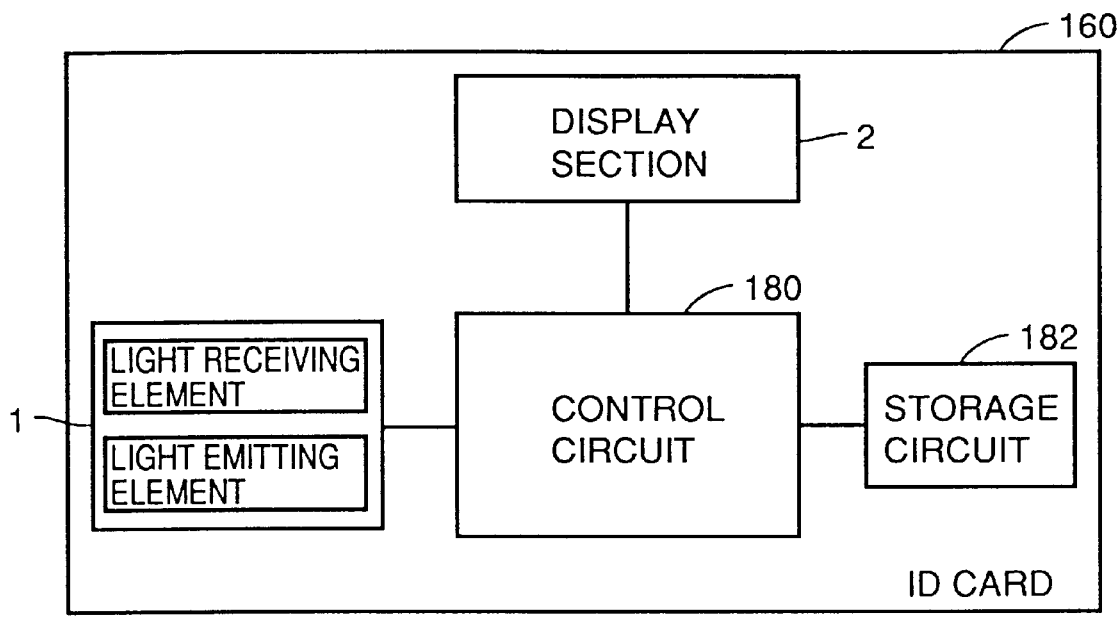
FIG. 23 is a block diagram of the conventional ID card.

Referring to FIG. 3, the components included in ID card 10 in addition to those of the conventional ID card 160 shown in FIG. 23 are: additional optical communication interface sections 3 and 8 as described above; a switch SW2 for selectively connecting optical communication interface sections 1, 3 and 8 to control circuit 180; and a switch control circuit 64 for controlling the switching by switch SW2. Switch control circuit 64 determines which one of signals sent from optical communication interface sections 1, 3 and 8 includes a signal from the read/write device, selects any one of the interface sections and connect the one to control circuit 180.

Figure 4:
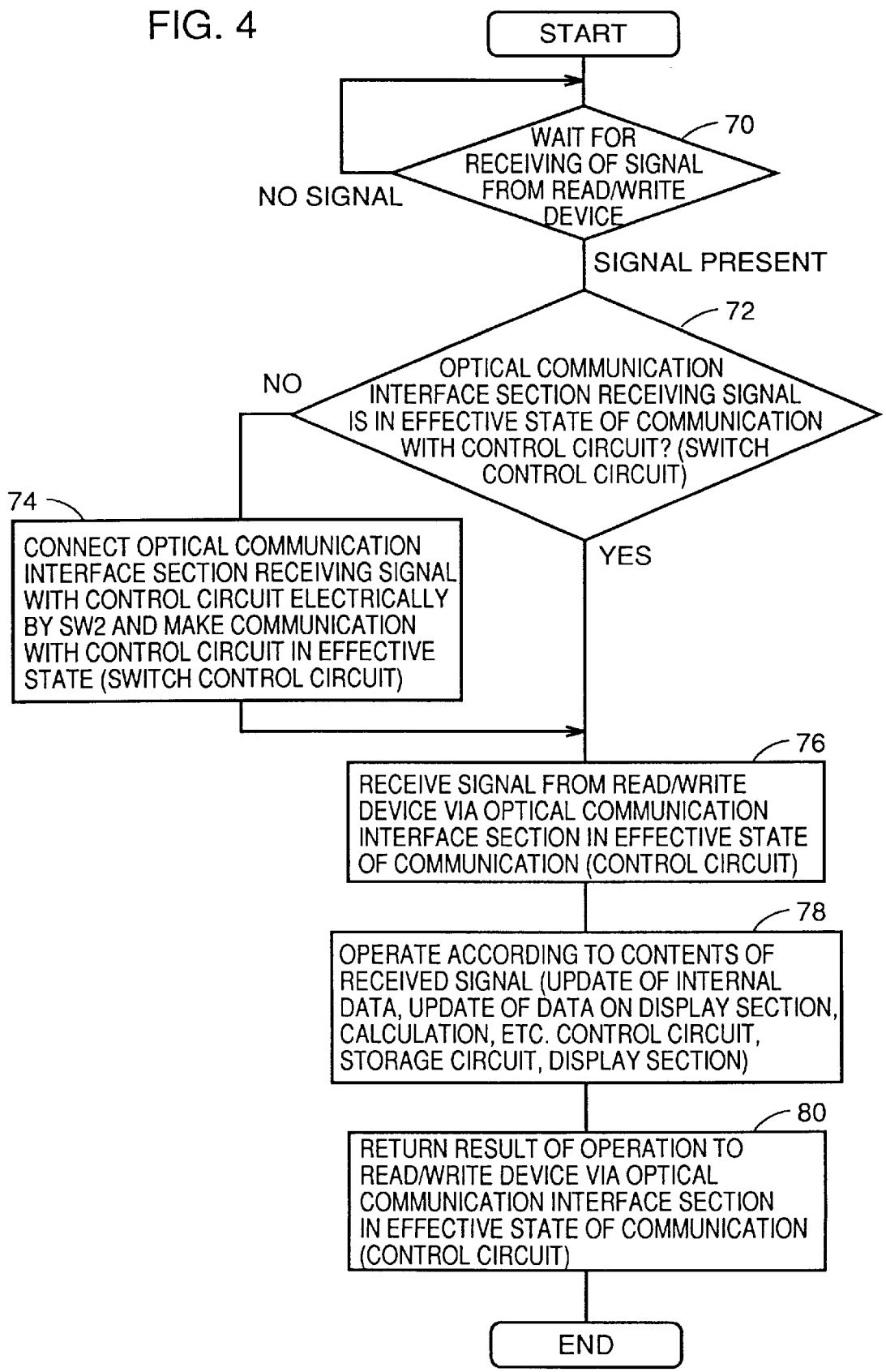
FIG. 4 is a flow chart showing a control structure of the processes carried out by the ID card of the first embodiment.
Figure 27:
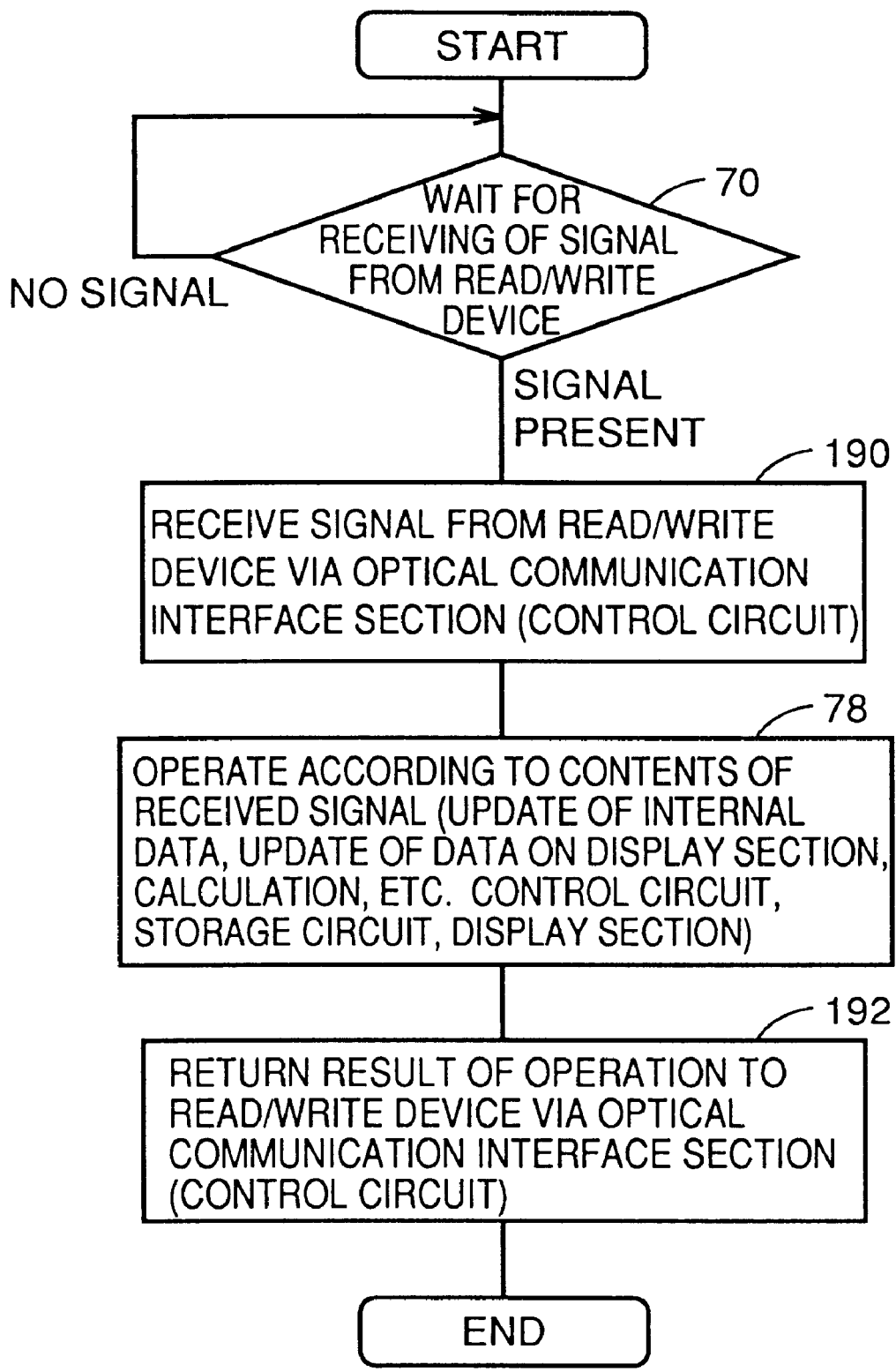
FIG. 27 is a flow chart showing a control structure of the processes carried out by the conventional ID card.
Figure 29A:
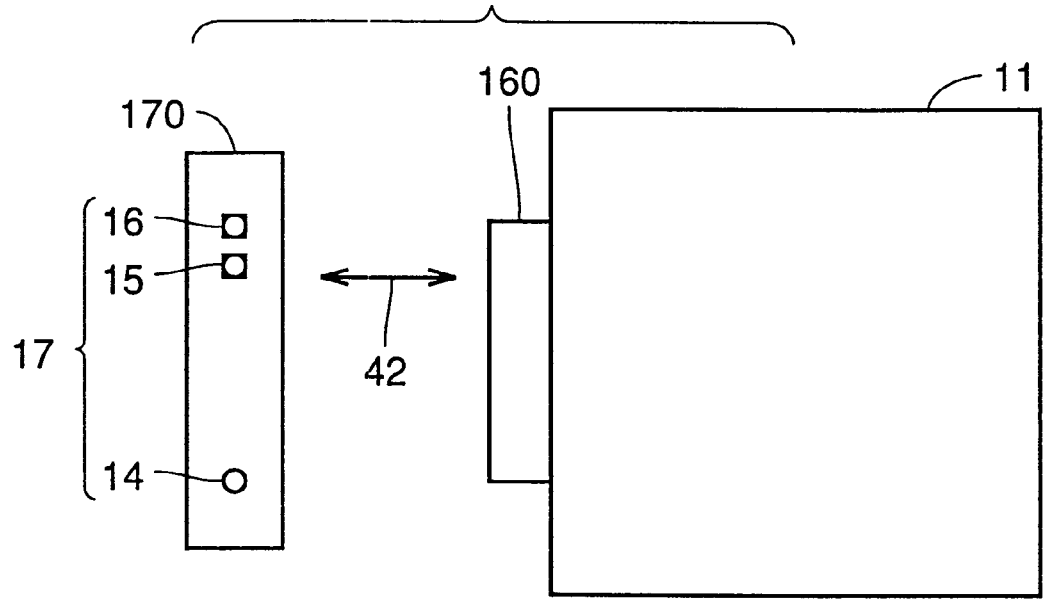
FIGS. 29A and 29B respectively show the top and side surfaces of FIG. 28.
Figure 29B:
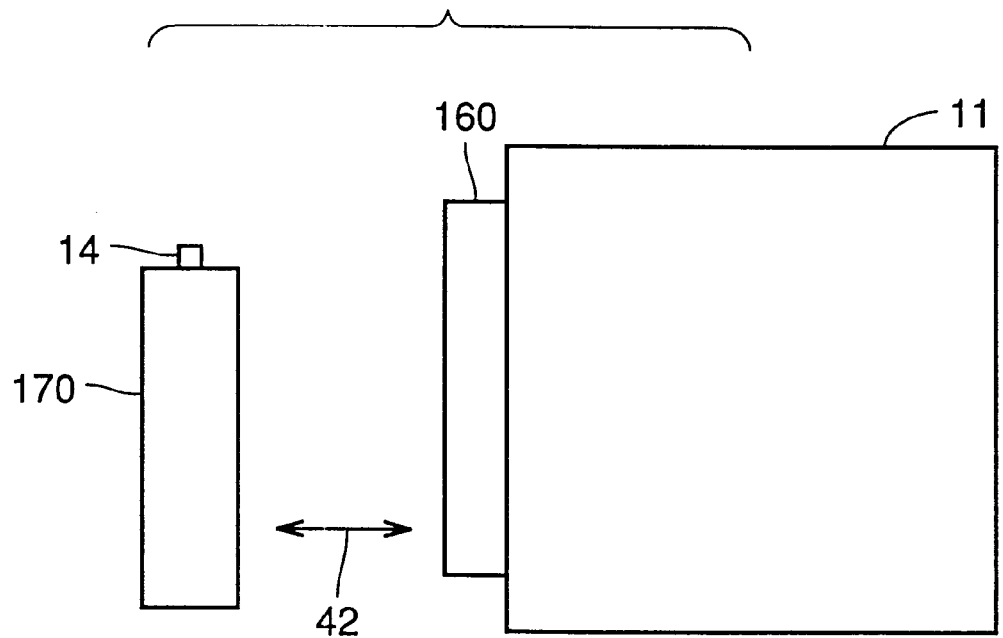
Figure 30:
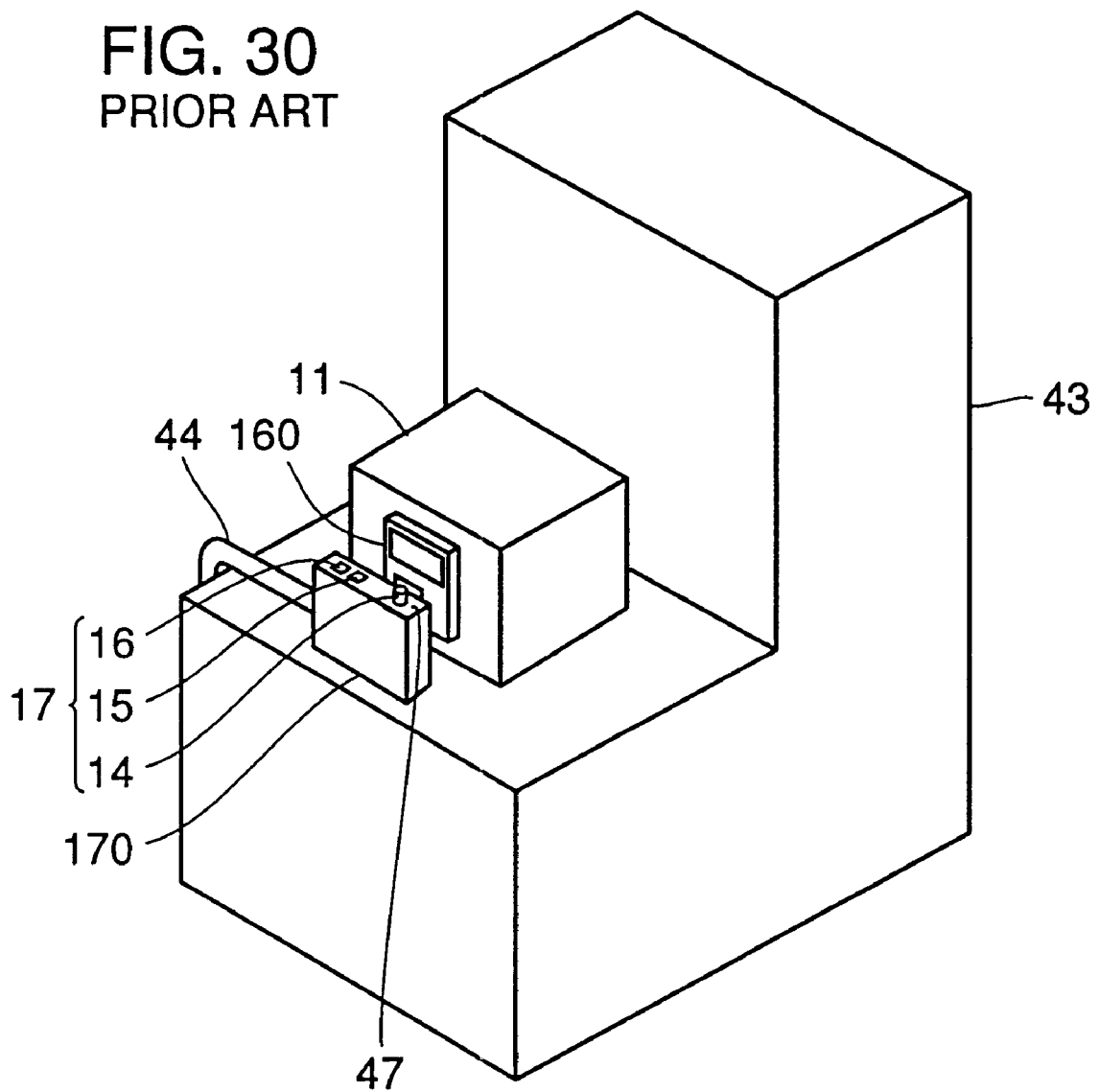
FIG. 30 is a perspective view of a conventional production apparatus.
Figure 31:
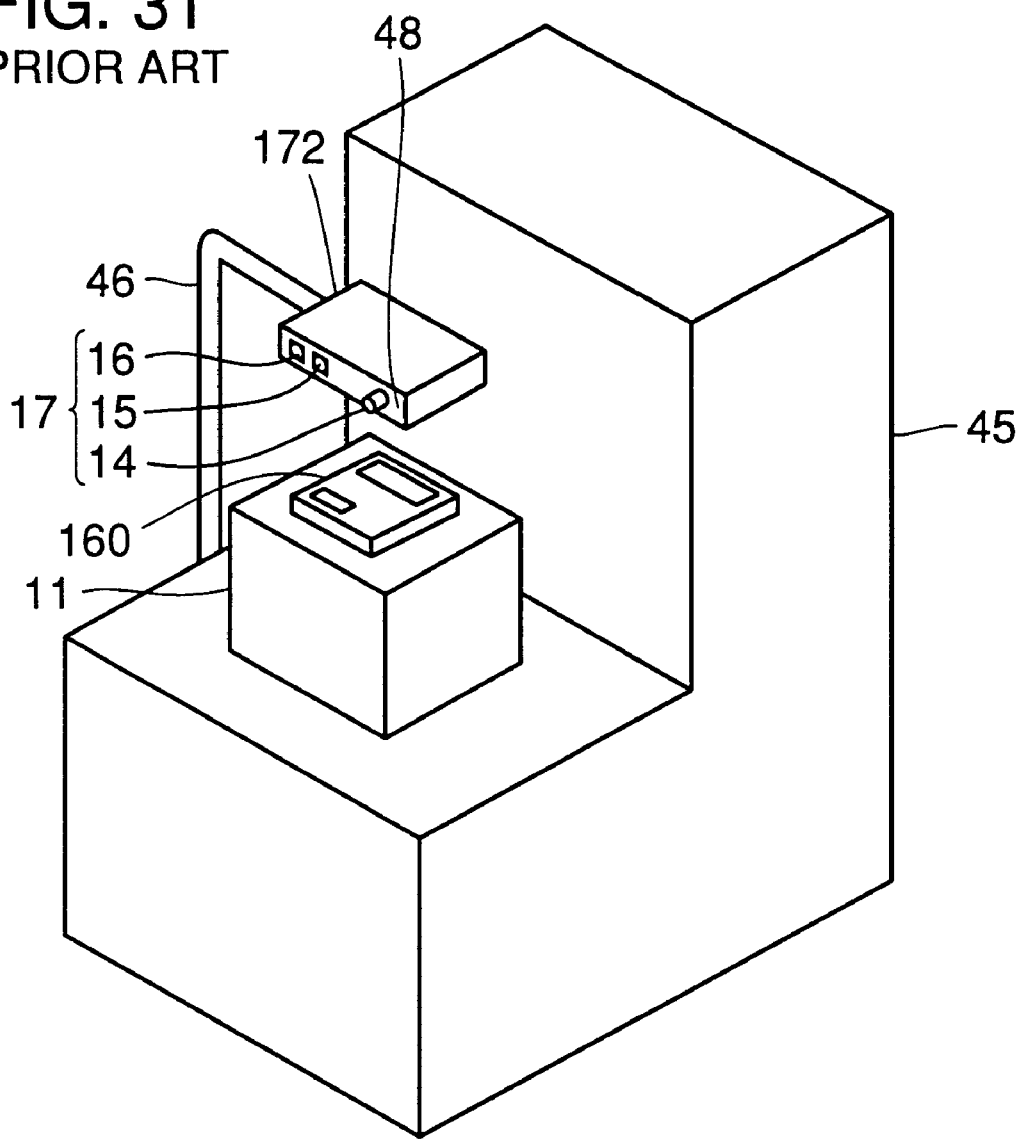
FIG. 31 is a perspective view of another example of the conventional production apparatus.

FIG. 4 shows a control structure of ID card 10 of FIG. 3. In FIG. 4, those blocks in which the process is identical to that shown in FIG. 27 are indicated by the same reference characters. The first is the state of waiting for reception of a signal from the read/write device (70). If a signal from the read/write device is received, it is determined whether communication between the control circuit and the optical communication interface section which has received the signal is effective or not (72). If effective, the control proceeds to the step 76. If the communication is not in the effective state, the optical communication interface section which received the signal is electrically connected to control circuit 180 by switching of switch SW2, and communication between control circuit 180 and the optical communication interface section is made effective (74).

In step 76, the signal is received from the read/write device via the optical communication interface section which is effective in communication. In step 78, operations according to the contents of the received signal such as update of internal data, update of data displayed on display section 2, and calculation are performed. In step 80, the result of the operations is transferred back to the read/write device via the optical communication interface section which is effective in communication.

Figure 5:
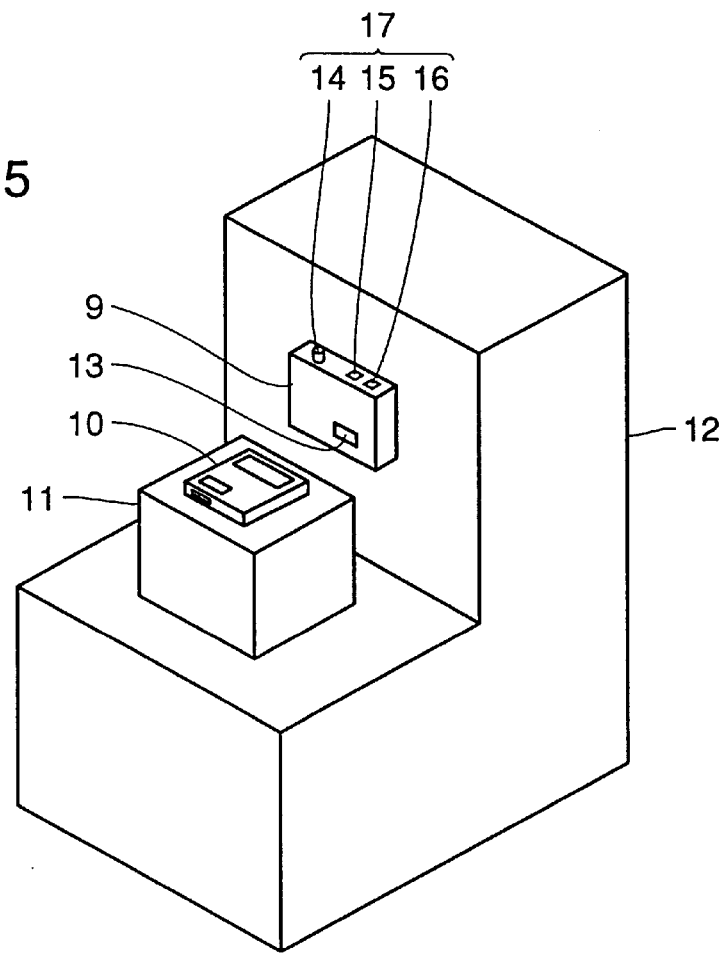
FIG. 5 is a perspective view of a production apparatus using the ID card of the first embodiment.
Figure 6:
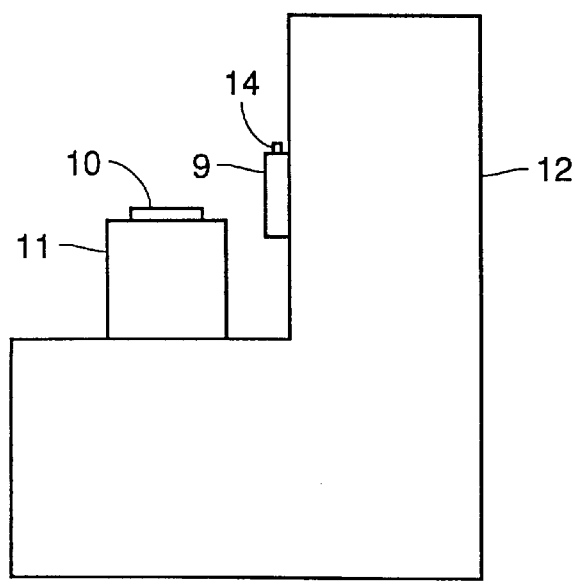
FIG. 6 is a side view of the production apparatus shown in FIG. 5.
Figure 24:
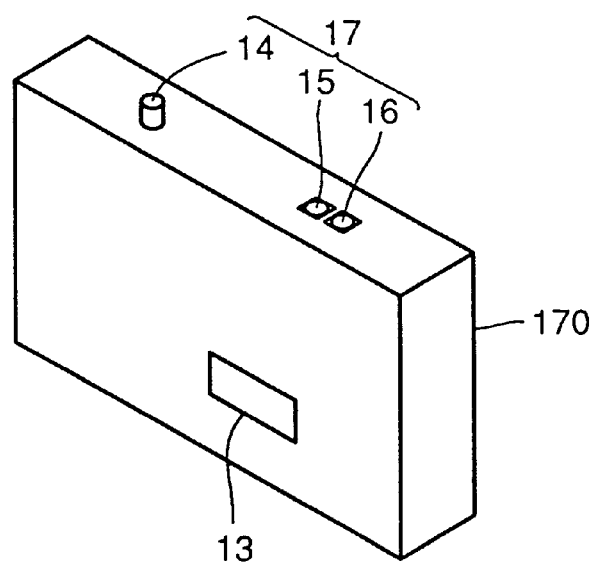
FIG. 24 is a perspective view of a conventional read/write device.
Figure 25:
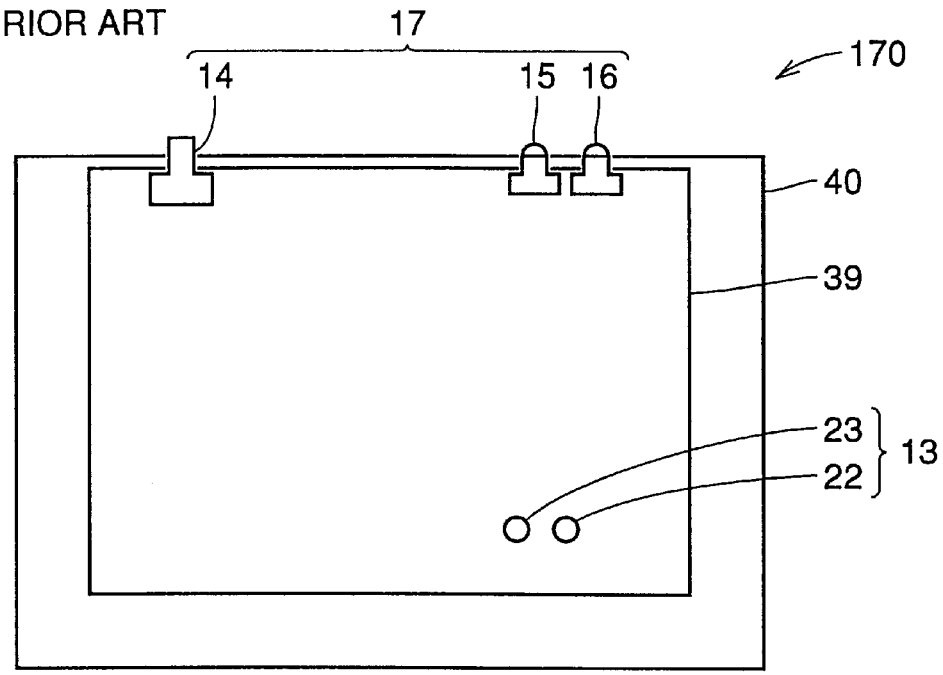
FIG. 25 is a front cross sectional view of the conventional read/write device.
Figure 26:
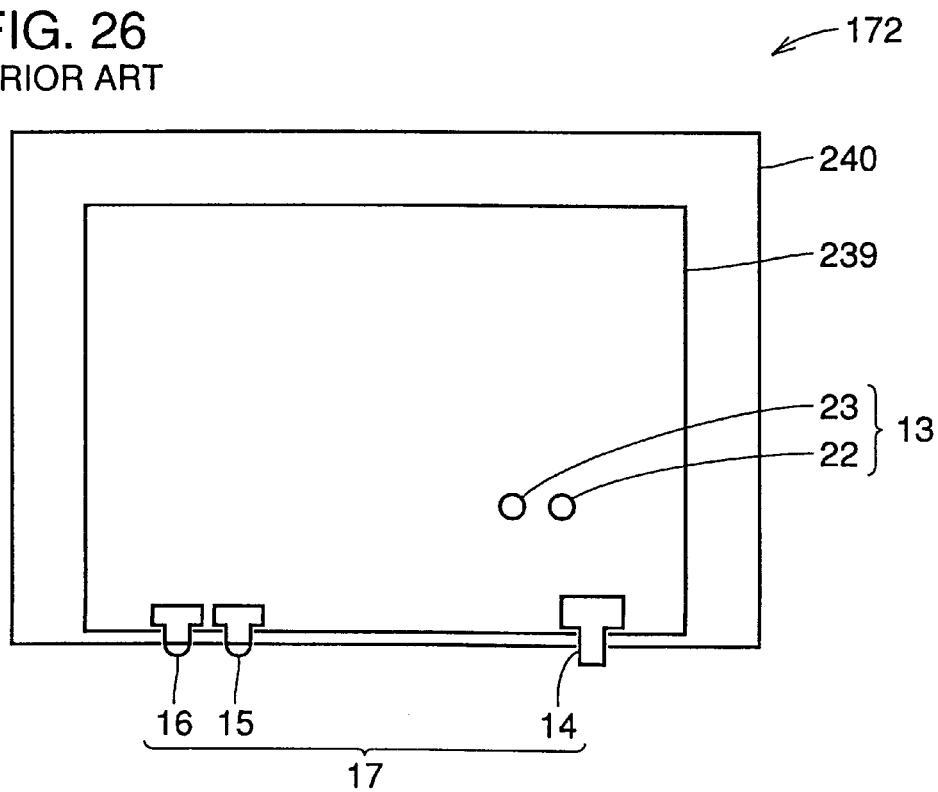
FIG. 26 is a front cross sectional view of another example of the conventional read/write device.

Referring to FIGS. 5 and 6, for a production apparatus 12, ID card 10 is attached to the top surface of work case 11. A read/write device 9 is provided to production apparatus 12 such that read/write device 9 is placed opposite to the top surface (not shown in FIG. 5) of ID card 10. Production apparatus 12 having a shape as shown in FIGS. 5 and 6 has a wall portion at the back side of the portion where work case 11 is placed. Therefore, read/write device 9 can be placed at the wall portion. Read/write device 9 is identical to the conventional read/write device 170 shown in FIGS. 24 and 25 in this embodiment. For production apparatus 12 having the shape as shown in FIGS. 5 and 6, read/write devices 9 can be placed at a position which enables a good optical communication between ID card 10 and read/write device 9. The reason is that the optical communication interface section is provided at the top surface of ID card 10.

Figure 7:
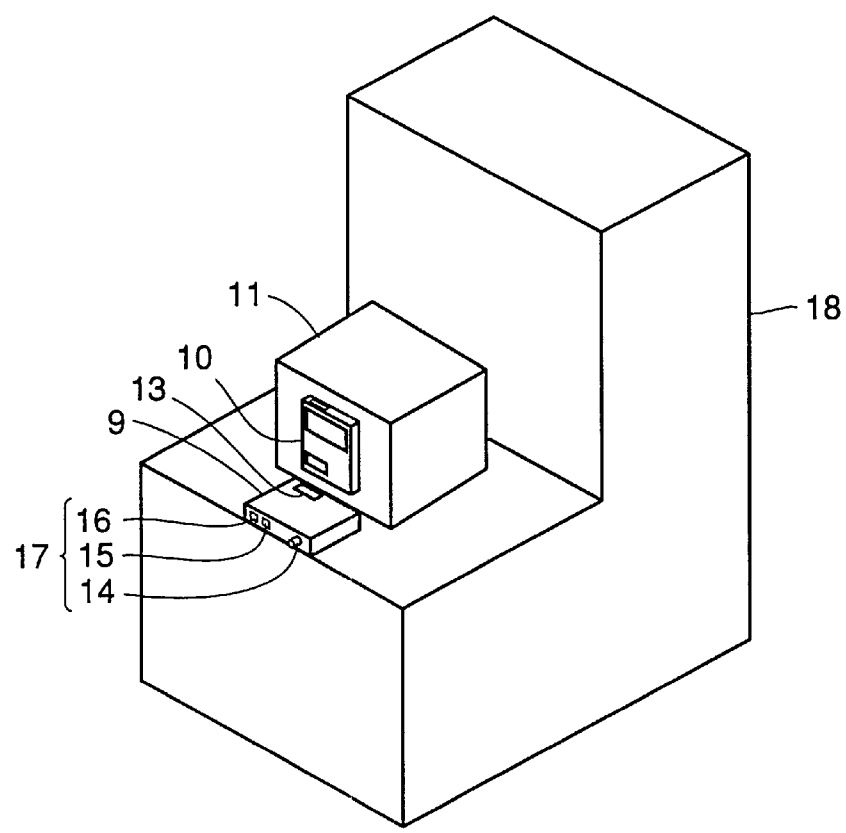
FIG. 7 is a perspective view of another production apparatus using the ID card of the first embodiment.
Figure 8:
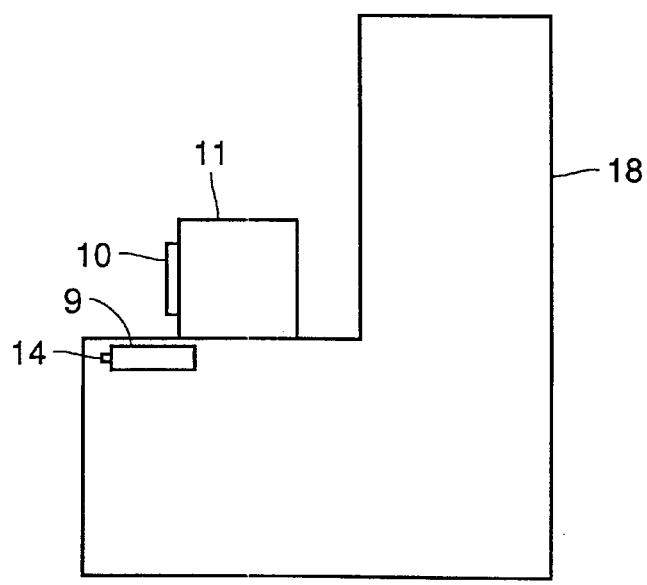
FIG. 8 is a side view of the apparatus shown in FIG. 7.

The optical communication interface section which is also provided at the bottom surface of ID card 10 produces a following effect. Referring to FIGS. 7 and 8, for another production apparatus 18, work case 11 is placed such that ID card 10 faces forward. In this case, read/write device 9 is provided on a table located at the front portion of production apparatus 18 such that optical communication interface section 13 of the read/write device 9 faces upward. This arrangement enables a good optical communication since read/write device optical communication interface section 13 is opposite to optical communication interface section 8 provided at the bottom surface of ID card 10.

Optical communication interface sections of ID card 10 of the first embodiment are directed in a plurality of directions. Therefore, the read/write device can be arranged such that the optical communication interface section of the device is opposite to any one of the plurality of optical communication interface sections of the ID card. The position of the read/write device can be selected out of a plurality of positions according to directions for placement of the work and positions for placement of the work that are different for each production apparatus. The position where the read/write device is placed can be decided such that the position does not hinder operations by an operator or a work transfer robot. Operations by the operator or the work transfer robot thus become easier and the productivity is improved. Further, the read/write device can be located at a position other than that above the work. Consequently, the user interface section is never operated above the work. Any foreign matter, dust or contaminant generated by the read/write device is prevented from dropping toward the work, and degradation of the quality of the product can be prevented.

In this embodiment, the optical communication interface sections of ID card 10 are provided at three positions of the front surface, the top surface and the bottom surface. However, the present invention is not limited thereto. The optical communication interface section at an arbitrarily one of the three positions may be removed, or an additional optical communication interface section may be provided at another surface.

(Second Embodiment)

Figure 9:
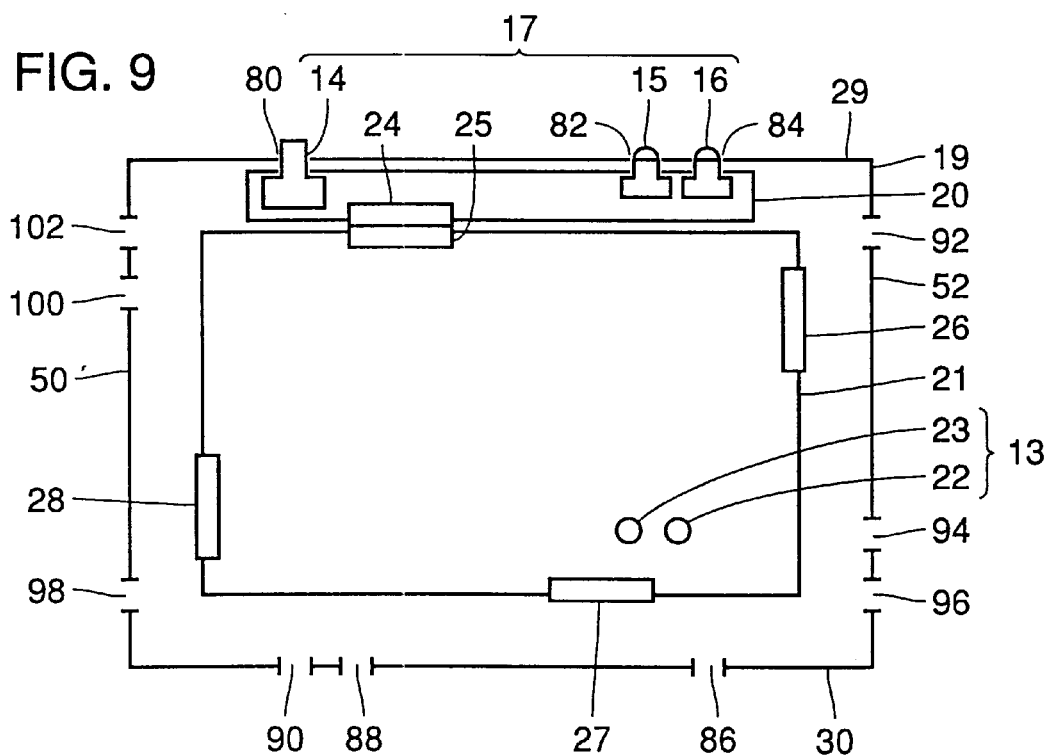
FIG. 9 is a front cross sectional view of a read/write device according to the second embodiment.
Figure 10:
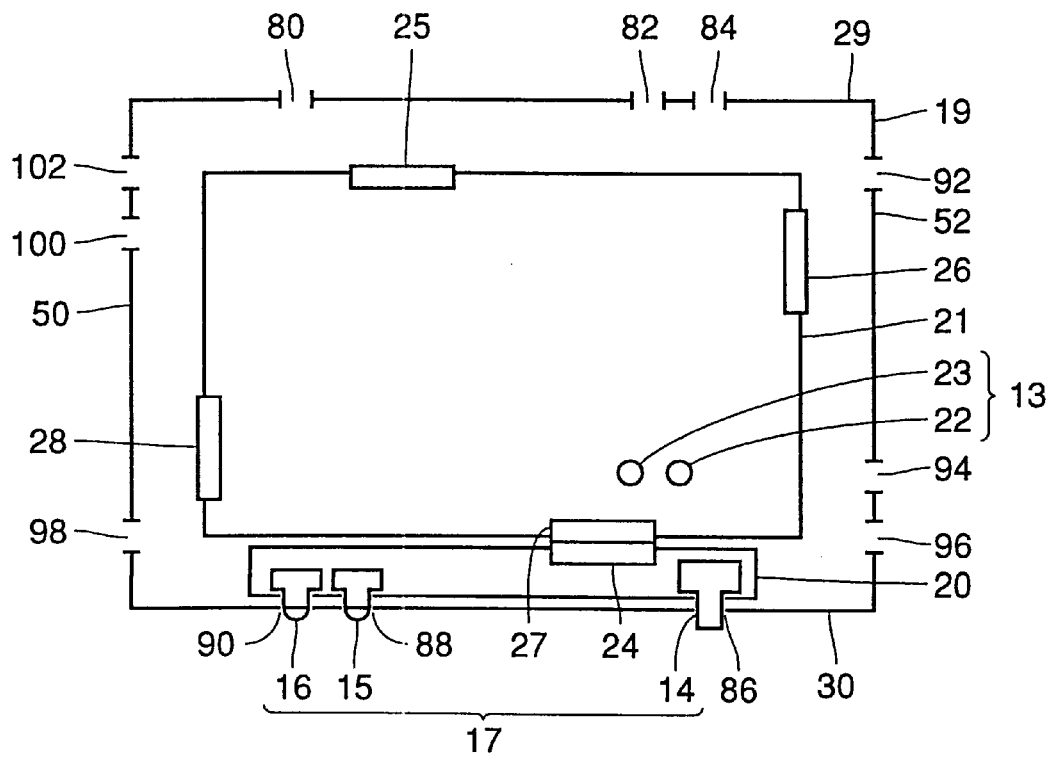
FIG. 10 is a front cross sectional view showing another structure of the read/write device of the second embodiment.

The second embodiment relates to an improvement of the read/write device. With reference to FIGS. 9 and 10, the read/write device according to the second embodiment is characterized in that the device has a user interface section board which can be attached to or removed from a main board of the read/write device, and has a plurality of connectors for joining the user interface section board to the main board. This characteristic enables the user interface section to be arranged at an arbitrary one of four surfaces 29, 30, 50 and 52 around the read/write device.

Referring to FIG. 9, a main board 21 and a user interface section board 20 are arranged on the inside of a case 19 of the read/write device. The case 19 has a shape of a rectangular parallelepiped. Main board 21 includes read/write device optical communication interface section 13 having optical transmitting section 22 and optical receiving section 23, main board connectors 25-28 for joining main board 21 to user interface section board 20, other elements (not shown) and interconnections (not shown). Main board connectors 25–28 are arranged at four sides of main board 21 of rectangular shape.

User interface section board 20 includes read/write start instructing section 14, read/write error display section 15, read/write device progress display section 16, a user interface section board connector 24 for joining board 20 to main board 21, other elements (not shown) and interconnections (not shown). In four side surfaces 29, 30, 50 and 52 of read/write case 19, openings 80, 82, 84, 86, 88, 90, 92, 94, 96, 98, 100, and 102 are formed in advance in which read/write start instructing section 14, read/write error display section 15 and read/write progress display section 16 are inserted from the inside.

In the example shown in FIG. 9, user interface section board connector 24 is joined to main board connector 25, and user interface section 17 is placed at upper surface 29 of the read/write device.

By removing user interface section board connector 24 from main board connector 25 and joining it to an arbitrary one of main board connectors 26, 27 and 28, user interface section 17 is formed at any of right side surface 52, bottom surface 30 and left side surface 50.

In the example shown in FIG. 10, user interface section board connector 24 is joined to main board 21 via main board connector 27. Read/write start instructing section 14, read/write error display section 15 and read/write progress display section 16 are respectively inserted into openings 86, 88 and 90 formed in bottom surface 30, and those can be operated or acknowledged from the outside.

The length of user interface board 20 is shorter than the length of side surfaces 50 and 52 (which is the length of the shorter side of the rectangular front surface of read/write device case 19). Connectors 25, 26, 27 and 28 are respectively provided at positions shifted by the same amount from the center of respective sides of the main board in the counterclockwise direction (or clockwise direction) about the center of the main board. As a result, user interface board 20 is not placed in a wrong direction.

If a read/write device is prepared such that the position of the user interface section can be selected out of four side surfaces 29, 30, 50 and 52, the read/write device can be placed at a position which enables the best operability and prevents generation of any foreign matter or dust, by selecting the optimum position of the user interface section according to the positions where the production apparatus, the ID card, and work case 11 are placed. Accordingly, preparation of read/write devices having structures of a plurality of types according to various combinations of the positions of the production apparatus, the ID card and the work case is unnecessary. If the read/write device case, the user interface section board, and the main board are formed as common components, read/write devices of various types can be implemented by combining those. By standardizing the components, the production cost of the read/write device can be decreased. Further, if the read/write device of the second embodiment is combined with the ID card according to the first embodiment, a more efficient production system can be structured.

(Third Embodiment)

Figure 11:
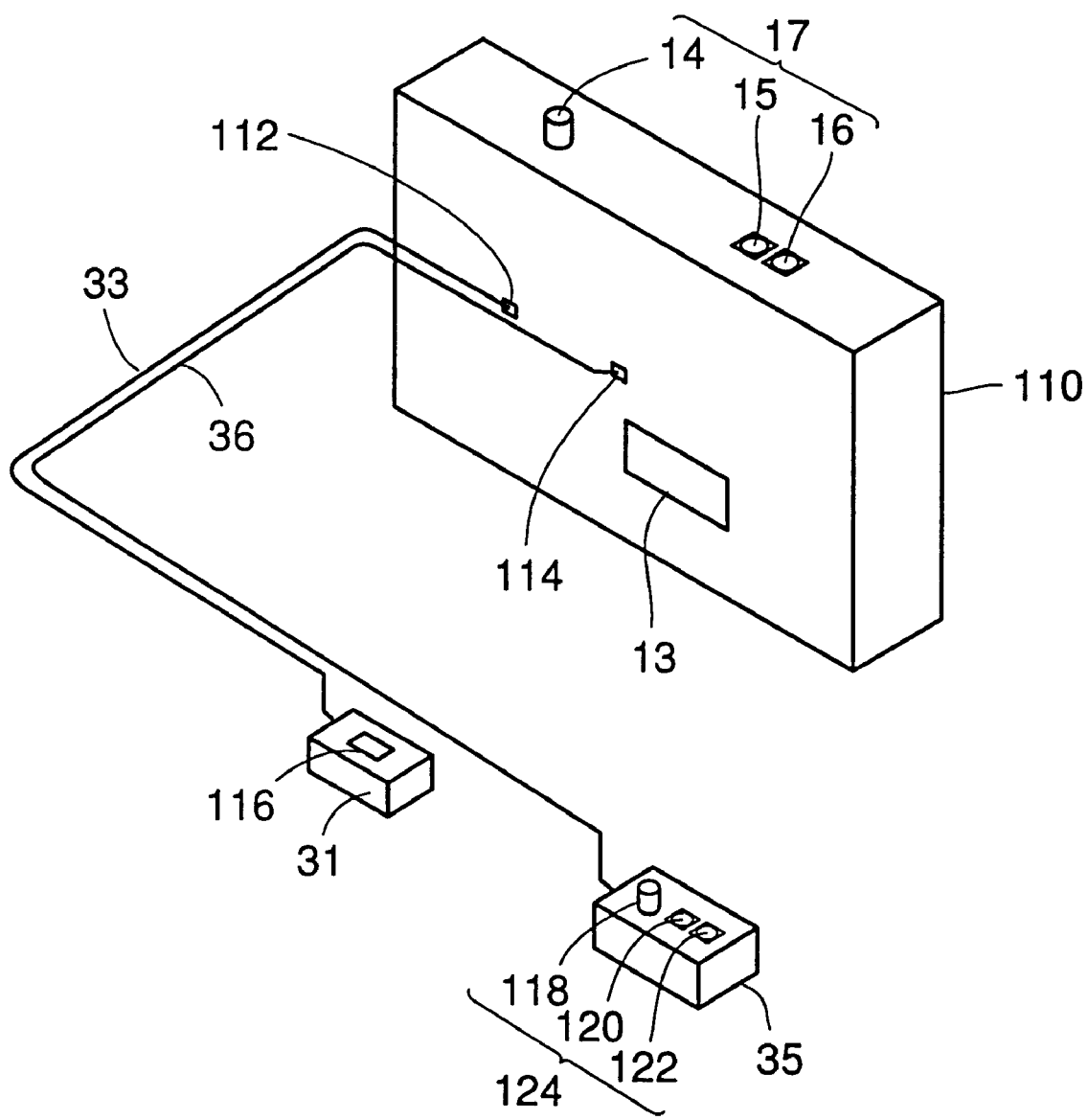
FIG. 11 is a perspective view of a read/write device according to the third embodiment.
Figure 12:
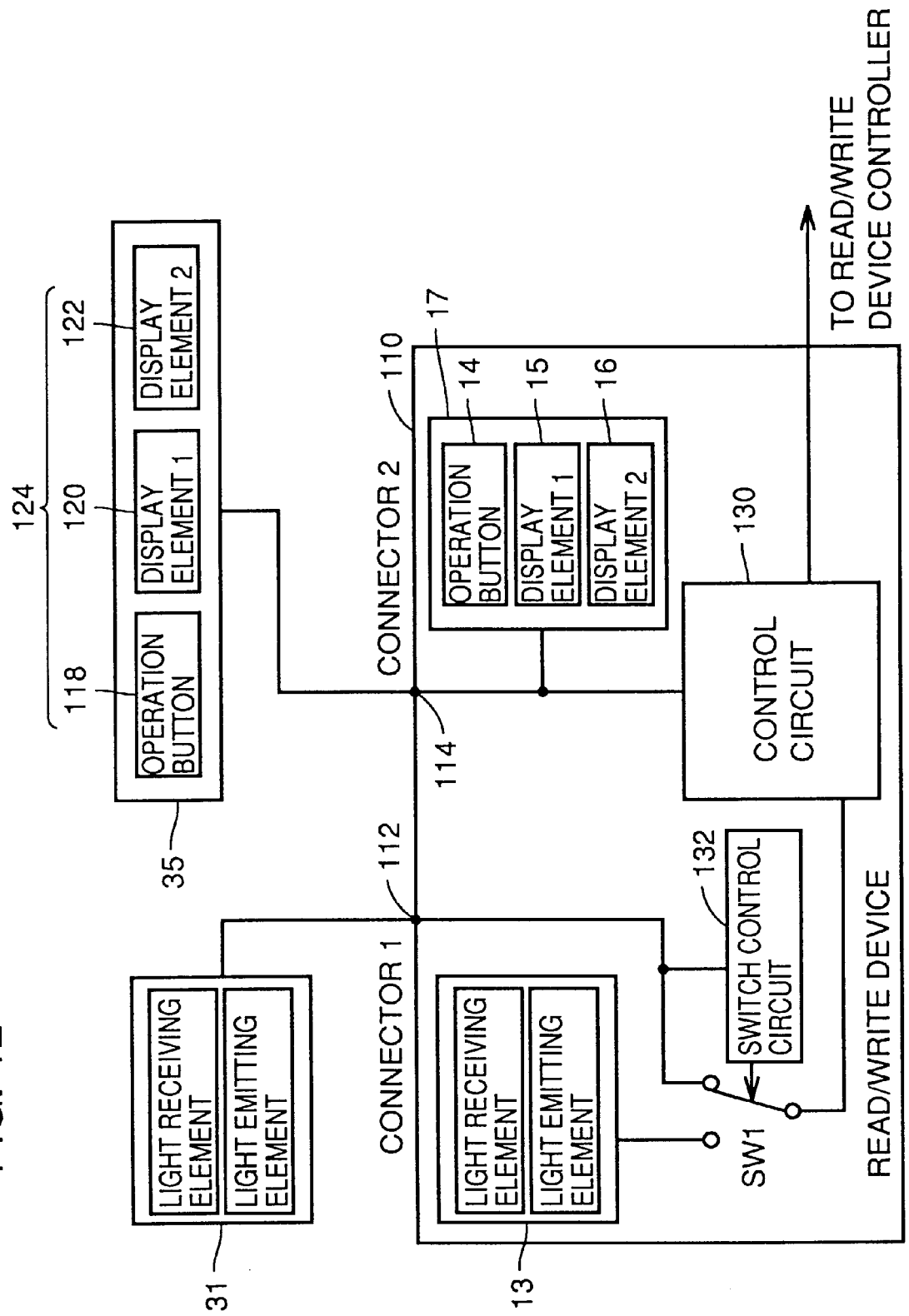
FIG. 12 is a block diagram of the read/write device of the third embodiment.

Referring to FIGS. 11 and 12, a read/write device of the third embodiment is connected to a separate optical communication interface unit 31 provided with an optical transmitting and receiving sections via a cable 33, and communicates with an ID card via the separate optical communication interface unit 31. The read/write device exchanges information with an operator via a user interface unit 35 having a case separated from a read/write device 110, and provided with a read/write start instructing section 118 which exchanges information with the operator, a read/write progress display section 122, and a read/write display section 120. This example of the production system becomes most effective if the ID card according to the first embodiment is employed. This is also the case with the fourth and fifth embodiments.

Referring to FIG. 11, optical communication interface unit 31 includes an optical communication interface section 116 having an optical receiving section (not shown) and an optical transmitting section (not shown). Optical communication interface section 116 is connected to read/write device 110 via a connector 112:,and optical communication interface unit cable 33. Optical communication interface unit 31 can communicate with the ID card via optical communication interface section 116 instead of read/write device optical communication interface section 13 provided for the main body.

User interface unit 35 includes a user interface section 124 having read/write start instructing section 118, read/write progress display section 122 and read/write error display section 120. User interface unit 35 is connected to read/write device 110 via a connector 114 and a user interface unit cable 36. The operator and read/write device 110 can exchange information via one of or both of user interface section 17 provided for read/write device 110 or user interface unit 35.

Referring to FIG. 12, read/write device 110 includes, in addition to those components described above, a control circuit 130 formed of an electronic circuit connected to connector 114 and a read/write device controller (not shown), a switch SW1 for connecting one of optical communication interface section 13 or connector 112 to control circuit 130, and a switch control circuit 132 for receiving a signal from connector 112 and switching switch SW1 according to whether there is any signal transmitted from optical communication interface unit 31. Optical communication interface section 13 or optical communication interface unit 31 is connected to an input/output section for optical communication of control circuit 130. User interface unit 35 is connected to an input/output section for the user interface provided for control circuit 130.

If optical communication interface unit 31 is connected to read/write device 110 via connector 112, switch control circuit 132 connects switch SW1 to optical communication interface unit 31. If optical communication interface unit 31 is not connected to read/write device 110, switch control circuit 132 connects switch SW1 to optical communication interface section 13.

If user interface unit 35 is connected to read/write device 110 via connector 114, user interface section 124 and user interface section 17 both function. If user interface unit 35 is not connected to read/write device 110, only user interface unit 17 functions. In other words, if user interface unit 35 is connected, any one of user interface section 17 provided at the main body and user interface section 124 can be operated.

Regarding the method of switching by switch control circuit 132, the electrical switching control as described above or a mechanical structure provided in relation to connector 112 may be possible.

Figure 13:
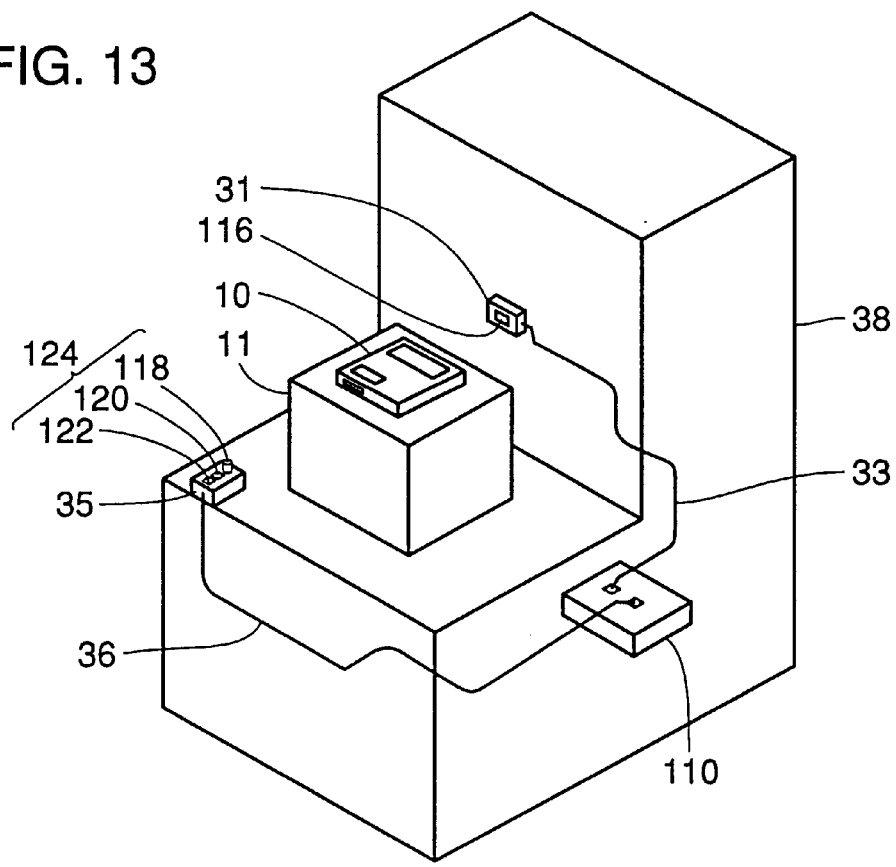
FIG. 13 is a perspective view of a production apparatus using the read/write device of the third embodiment.
Figure 14:
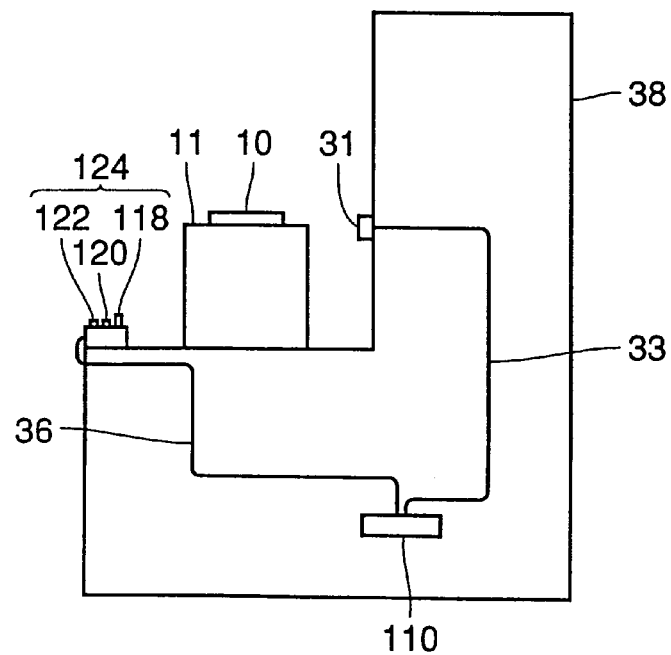
FIG. 14 is a side view of the production apparatus shown in FIG. 13.

Referring to FIGS. 13 and 14, a production apparatus 38 using read/write device 110 of the third embodiment and ID card 10 of the first embodiment is shown. For production apparatus 38, work case 11 is placed on production apparatus 38 such that ID card 10 is located at the top surface of work case 11. In this case, at the top surface of ID card 10 (not shown in FIG. 13), the optical communication interface section is provided. As shown in FIG. 13, optical communication interface unit 31 is fixed at a position opposite to the top surface of ID card 10. Further, user interface unit 35 is fixed at the left end of the front portion of the top surface of the table at the front side of production apparatus 38. The main body of read/write device 110 is placed at the inner space of production apparatus 38. The main body and units 31 and 35 are connected via cables 33 and 36.

This arrangement enables the optical communication between read/write device 110 and the optical communication interface section (not shown) provided at the top surface of ID card 10 via optical communication interface unit 31. In addition, an operator can exchange information with read/write device 110 using user interface unit 35 placed at the left end of the top surface of the table.

By providing optical communication interface unit 31 and user interface unit 35 separated from the main body and connecting those units to the main body by the cables, the limitations of the position and the posture of the placement of the read/write device for the optical communication with ID card can be overcome. As a result, the read/write device can be located at any position which does not hinder operations by the operator or the work transfer robot. An easy operation by the operator or the work transfer robot as well as improvement of the productivity can be obtained.

In this embodiment, the exchange of information between the read/write device and the operator is possible via user interface unit 35. Since there is no limitation of the position of user interface unit 35, the unit 35 can be placed at a position which is most convenient for the operator. An easy operation by the operator and improvement of the productivity can be obtained.

In this embodiment, the user interface unit can be placed at a position other than that near the work. Since the operation by the user is carried out at a place other than that the work, any foreign matter or dust does not adhere to the work through the operation of the user interface. Degradation of the quality of the product is thus prevented. Degradation of the quality of the product can be prevented more effectively since the user interface unit is not required to be placed near the work or above the work.

(Fourth Embodiment)

Figure 15:
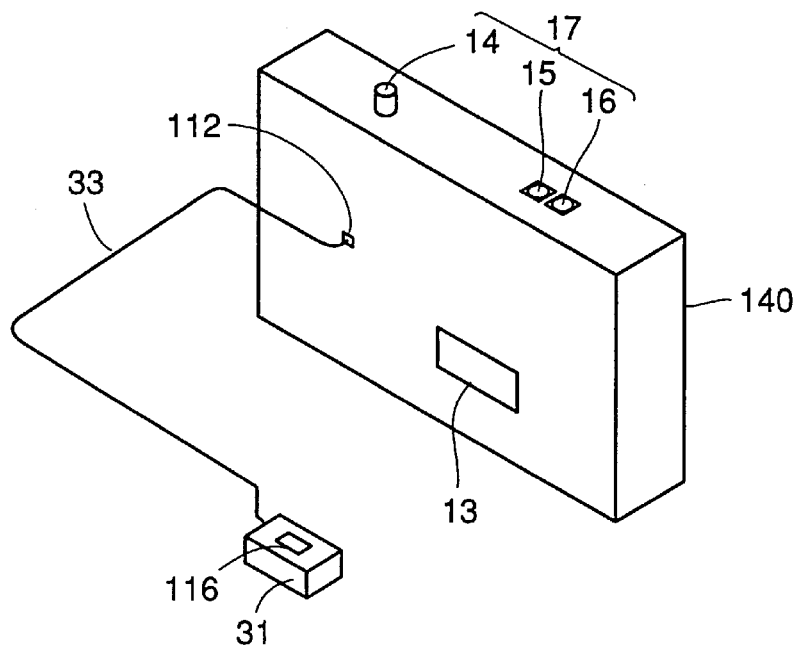
FIG. 15 is a perspective view of a read/write device according to the fourth embodiment.

FIG. 15 shows a perspective view of a read/write device 140 according to the fourth embodiment. The device of the fourth embodiment does not include user interface unit 35, cable 36 and connector 114 provided for read/write device 110 of the third embodiment shown in FIG. 11. In FIG. 15, components identical to those of FIG. 11 are indicated by the same reference characters, and detailed description thereof is not repeated here.

Figure 16:
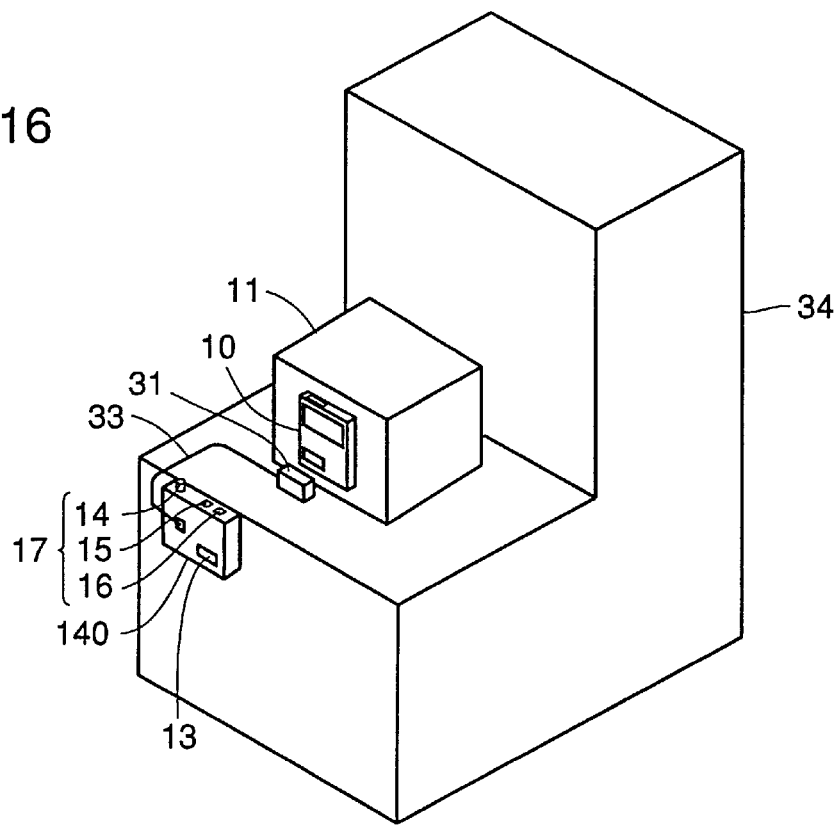
FIG. 16 is a perspective view of a production apparatus using the read/write device shown in FIG. 15.
Figure 17:
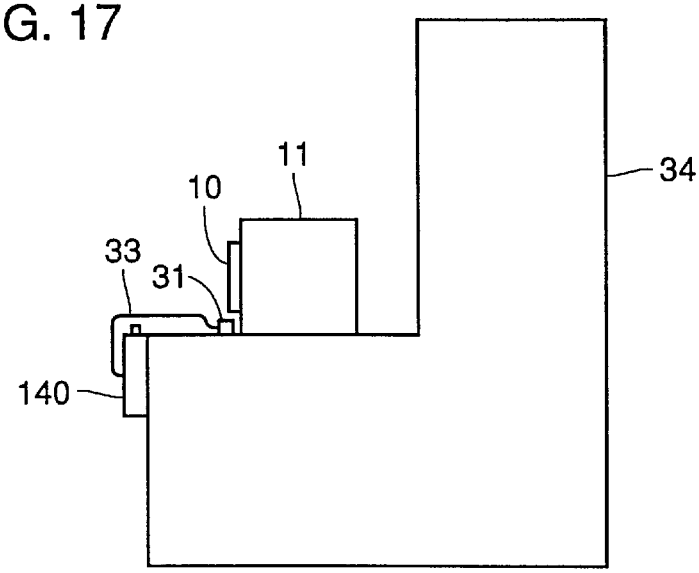
FIG. 17 is a side view of the production apparatus shown in FIG. 16.

If optical communication interface unit 31 only is provided separately, the following effect can be obtained. Referring to FIGS. 16 and 17, for a production apparatus 34, work case 11 is located at a position such that ID card 10 is provided at the front surface of the case, for example. In this case, read/write device 140 can be positioned at the front surface of production apparatus 34, for example, optical communication interface unit 31 only is placed at the top surface of the table of the front portion of apparatus 34 such that interface unit 31 only is opposite to the bottom surface of ID card 10, and the interface unit 31 can be connected to read/write device 140 via cable 33. This arrangement can also overcome the limitation of the position of placement of read/write device 140 for optical communication with ID card 10. The main body of read/write device 140 can be placed at a position which does not hinder operations by the operator or the work transfer robot. Easier operations by the operator or the work transfer robot as well as improvement of the productivity can be obtained. Further, read/write device 140 can be positioned at a place other than that near work case 11. Accordingly, the operator is not required to operate the user interface near the work. As a result, any foreign matter or dust does not adhere to the work and degradation of the quality of the product due to the operation can be prevented.

(Fifth Embodiment)

Figure 18:
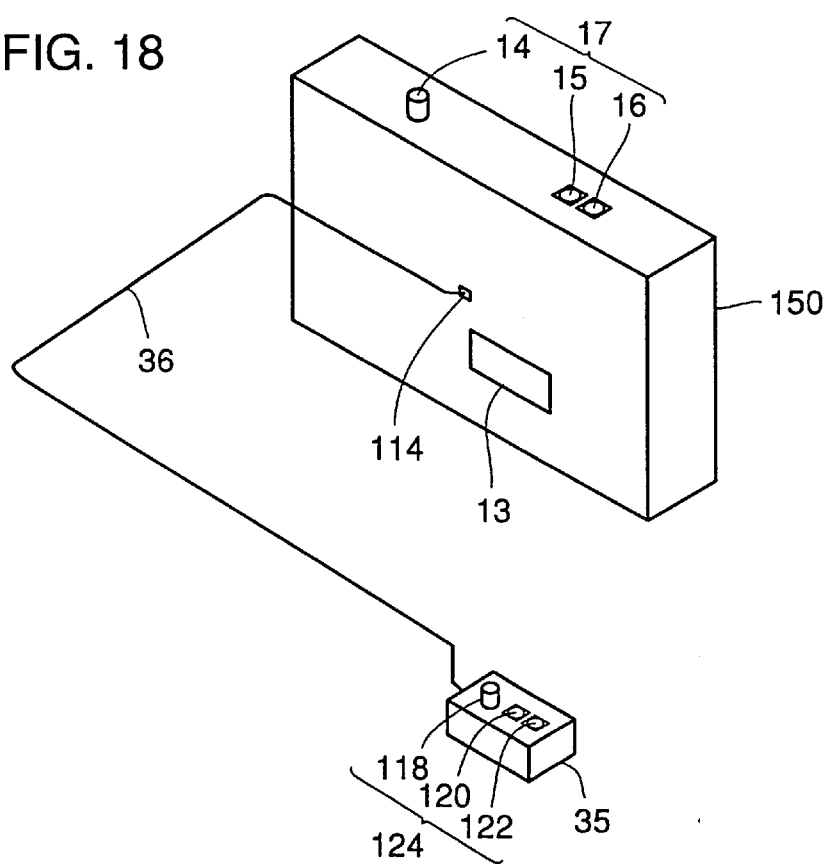
FIG. 18 is a perspective view of a read/write device according to the fifth embodiment.

FIG. 18 shows a perspective view of a read/write device 150 according to the fifth embodiment. Read/write device 150 does not include optical communication interface unit 31, cable 33 and connector 112 of read/write device 110 of the third embodiment. In FIG. 18, components identical to those of FIG. 11 are indicated by the same reference characters. The functions of those components are also identical. Detailed descriptions of those are not repeated here.

Figure 19:
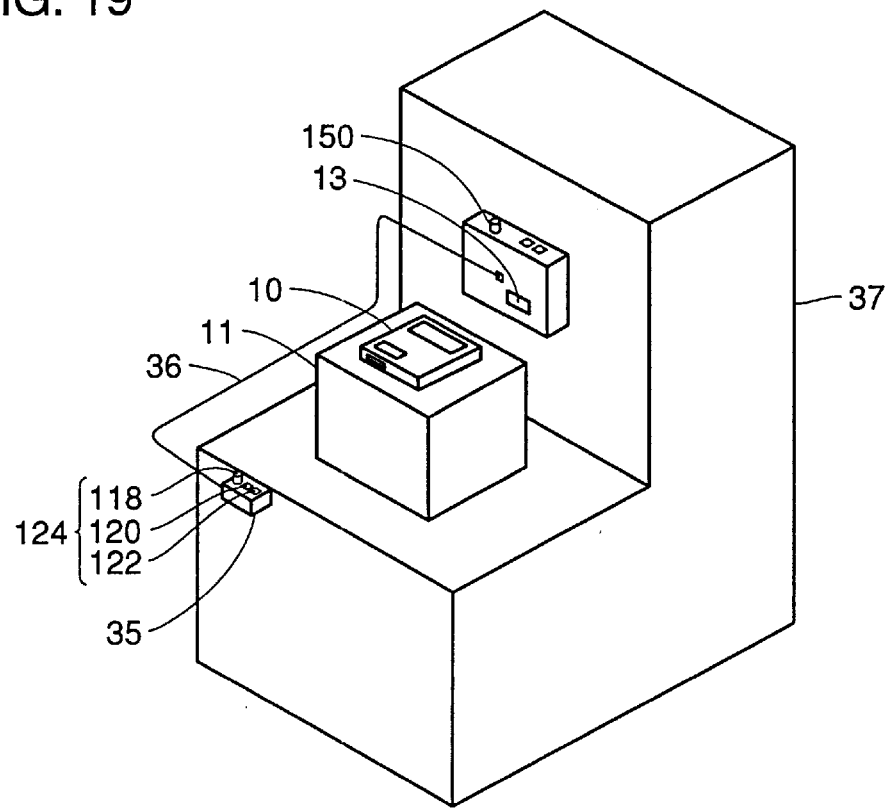
FIG. 19 is a perspective view of a production apparatus using the read/write device of the fifth embodiment.
Figure 20:
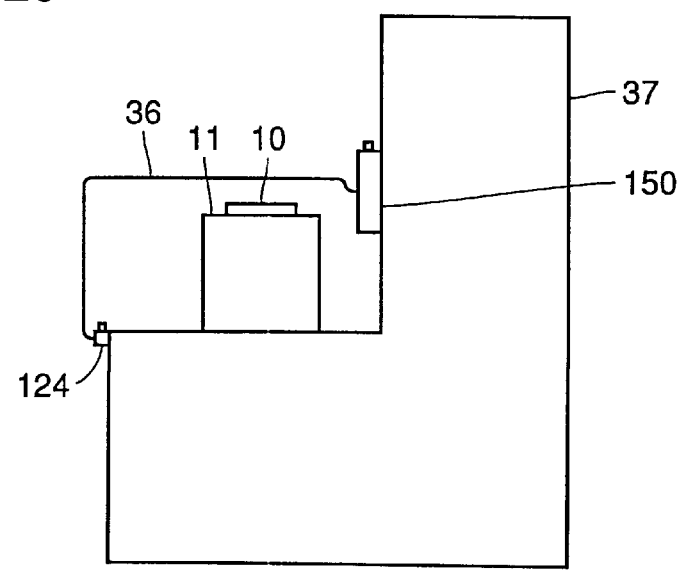
FIG. 20 is a side view of the production apparatus shown in FIG. 19.

Referring to FIGS. 19 and 20, a production apparatus 37 at which the read/write device is provided has a table on the front side on which work case 11 is placed, and has a wall portion on the back side of it. Work case 11 is located on the table of production apparatus 37 such that ID card 10 is located at the top surface of the case.

As heretofore described, the top surface of ID card 10 is provided with an optical communication interface section (not shown). By placing read/write device 150 on the wall portion of the rear part of production apparatus 37 as shown in FIG. 19, read/write device 150 can exchange information with the optical communication interface section provided at the top surface of ID card 10. Since user interface unit 35 can be placed at an arbitrary position, the unit 35 can be arranged at the upper part of the front surface of apparatus 37 as shown in FIG. 19. In this case, the user interface is operated at a place other than that near work case 11, and any foreign matter or dust generated through the operation of the user interface does not have an adverse effect to work case 11. As described above, user interface unit 35 can be placed at a position which is most convenient for the operator. Read/write device 150 can be positioned at a place which does not hinder the operator. As a result, an easier operation by the operator as well as improvement of the productivity can be obtained.

According to the present invention, the information card is provided with optical communication interface sections at a plurality of surfaces. The position of the read/write device can be selected, out of a plurality of positions which enable optical communication with the plurality of optical communication interface sections, as a position which does not hinder the operation by the operator or the work transfer robot. The read/write device can be placed at a position which can avoid an adverse effect of any foreign matter or dust generated through the handling of the read/write device to the work. As a result, the improvement of the operational efficiency of the operator or the work transfer robot, the increase of the productivity and the improvement of the quality of the product can be achieved.

According to another aspect of the invention, the user interface section can be placed at a desired surface out of a plurality of surfaces of the case. The read/write device can be placed at a position which does not hinder the operator or the work transfer robot and does not have an adverse effect to the work in the optical communication with the information card, and the user interface section can be placed at a position which enables an easier operation by the operator. Preparation of read/write devices of a plurality of types is unnecessary, and just common components may be prepared. As a result, the operational efficiency of the operator or the work transfer robot is improved, the productivity is increased, and the quality of the product is enhanced. Further, the production cost of the read/write device can be decreased.

According to still another aspect of the invention, since the optical communication interface unit or the user interface unit is provided separately from the case of the read/write device, there is no limitation of the position of the placement of the case of the read/write device in the optical communication with the information card or in the operation of the user interface. The read/write device and the optical communication interface or the user interface unit can be placed at positions which do not hinder the operator or the work transfer robot and do not have an adverse effect to the work, and the optical communication interface unit or the read/write device can be placed at a position which enables an easier optical communication with the information card. Consequently, improvement of the operational efficiency of the operator or the work transfer robot, the enhancement of the productivity and the improvement of the product quality can be obtained.

The user interface unit can be located at a position which does not have an adverse effect to the work through the operation of the unit. As a result, the quality of the product is further improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An information card for identifying a piece of work, said information card having an optical communication function in use attached to a work case and carried with the work in a production system, comprising:

a card body having a plurality of surfaces;

a plurality of optical communication interface sections provided respectively at different ones of said plurality of surfaces, wherein each of said plurality of optical communication interface sections receive or send signals;

a control circuit for receiving signals from said optical communication interface sections; and a switch for selecting among said plurality of optical communication sections from which said control circuit receives signals.

2. The information card according to claim 1, wherein said plurality of optical communication interface sections include first and second optical communication interface sections, said optical interface sections respectively provided at two adjacent surfaces of said plurality of surfaces of said card body.

3. The information card according to claim 2, wherein said card body includes:

a first surface which faces the work case, a second surface back to back with said first surface, and a third surface which connects said first surface to said second surface when said information card is attached to the work case, said first optical communication interface section is provided on said second surface, and said second optical communication interface section is provided on said third surface.

4. The information card according to claim 1, wherein said plurality of optical communication interface sections include first and second optical communication interface sections, said optical interface sections respectively provided at two non-adjacent surfaces of said plurality of surfaces of said card body.

5. The information card according to claim 4, wherein said card body includes:

a first surface which faces the work case, a second surface back to back with said first surface, a pair of third surfaces back to back with each other which connect said first surface to said second surface when said information card is attached to the work case, said first optical communication interface section is provided on one of said pair of third surfaces, and said second optical communication interface section is provided on the other of said pair of third surfaces.

6. The information card according to claim 1, wherein said card body includes:

a first surface which faces the work case, a second surface back to back with said first surface, a third surface and a fourth surface that connect said first surface to said second surface when said information card is attached to work the case, and said plurality of optical communication interface sections include a first optical communication interface section provided on said second surface, and a second optical communication interface section and a third said optical communication interface section provided respectively at said third surface and said fourth surface.

7. The information card according to claim 6, further comprising a display section, said display section provided on said second surface.

8. The information card according to claim 1, further comprising an on-card control circuit for controlling said switch, said on-card control circuit coupled between said plurality of optical communication interface sections and said switch.

* * * * *